United States Patent [19]

Kita et al.

[11] Patent Number: 4,937,161

[45] Date of Patent: Jun. 26, 1990

[54] PHOTOPOLYMERIZABLE COMPOSITION

[75] Inventors: Nobuyuki Kita; Mitsuru Koike, both of Shizuoka, Japan

[73] Assignee: Fuji Photo Film Co., Ltd., Kanagawa, Japan

[21] Appl. No.: 214,938

[22] Filed: Jul. 5, 1988

[30] Foreign Application Priority Data

Jul. 6, 1987 [JP] Japan .................................. 62-168190

[51] Int. Cl.$^5$ .............................................. G03C 1/76
[52] U.S. Cl. .................................... 430/281; 430/914; 430/916; 430/920; 522/25; 522/121
[58] Field of Search ............... 430/920, 914, 281, 910; 522/25, 121

[56] References Cited

U.S. PATENT DOCUMENTS

| | | | |
|---|---|---|---|
| 3,987,037 | 10/1976 | Bonham et al. | 260/240 |
| 4,320,189 | 3/1982 | Taguchi et al. | 430/920 |
| 4,399,211 | 8/1983 | Kondo et al. | 430/920 |
| 4,636,459 | 1/1987 | Kawamura et al. | 430/920 |
| 4,661,434 | 4/1987 | Iwasaki et al. | 430/920 |
| 4,772,530 | 9/1988 | Gottschalk et al. | 430/914 |
| 4,772,534 | 9/1988 | Kawamura et al. | 430/920 |
| 4,772,541 | 9/1988 | Gottschalk et al. | 430/914 |
| 4,788,124 | 7/1988 | Wright | 430/914 |

FOREIGN PATENT DOCUMENTS 223587  5/1987  European Pat. Off. .

Primary Examiner—Jack P. Brammer
Attorney, Agent, or Firm—Burns, Doane, Swecker & Mathis

[57] ABSTRACT

A photopolymerizable composition containing a polymerizable compound having an ethylenically unsaturated bond, a photopolymerization initiator, and if necessary, a linear organic hibh molecular weight polymer. The photopolymerization initiator comprises a combination of (a) at least one organic boron compound anion salt of an organic cationic dye, andd (b) a compound represented by formula (I):

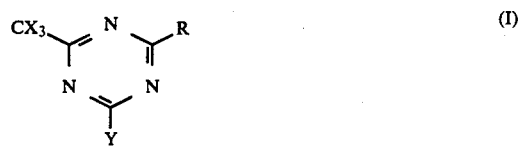

(I)

wherein x represents a halogen atom; Y represents —CH$_3$, —NH$_2$, —NHR', —N(R')$_2$, or —OR' wherein R' represents an alkyl group, a substituted alkyl group, an aryl group, or a substituted aryl group; and wherein R represents —CX$_3$, an alkyl group, a substituted alkyl group, an aryl group, a substituted aryl group, or a substituted alkenyl group.

23 Claims, No Drawings

PHOTOPOLYMERIZABLE COMPOSITION

FIELD OF THE INVENTION

The present invention relates to a photopolymerizable composition. More particularly, the present invention relates to a photopolymerizable composition containing a polymerizable compound having an ethylenically unsaturated bond, a photopolymerization initiator having a novel composition, and if necessary, a linear organic high molecular weight polymer.

BACKGROUND OF THE INVENTION

It is known to reproduce images by photographic means using a photosensitive composition composed of a mixture of a polymerizable compound having an ethylenically unsaturated bond, a photopolymerization initiator, and further, if necessary, a binder having a proper film-forming faculty and a heat polymerization inhibitor. As described in U.S. Pat. Nos. 2,927,022, 2,902,356, and 3,870,524, since the above-described type of photosensitive composition upon photopolymerization by irradiation of light is hardened and insolubilized, by forming a proper film or layer of the photosensitive composition, light-exposing the film or layer through a desired negative, and removing unexposed portions only by a proper solvent (hereinafter referred to as "development"), desired hardened images of the photosensitive composition can be formed. Such a photosensitive composition is, as a mater of course, very useful for making printing plates, etc.

Also, since a polymerizable compound having an ethylenically unsaturated bond itself does not have sufficient photosensitivity, it has previously been proposed to add thereto a photopolymerization initiator for increasing the photosensitivity thereof. Examples of such photopolymerization initiators include benzyl, benzoin, benzoin ethyl ether, Michler's ketone, anthraquinone, acridine, phenazine, benzophenone, and 2-ethylanthraquinone.

In the past, however, when the above-described conventional-type photopolymerization initiators have been used, the photopolymerizable composition has shown low responsiveness to hardening. Furthermore, image exposure for forming images requires a long period of time. Accordingly, when precise images are to be formed, if the operation is accompanied by a slight vibration, images having good image quality are not reproduced. Furthermore, the radiation amount of light energy for light exposure must be increased, which results in the formation of large amounts of heat. There is also a problem with the formation of heat in a film of the photosensitive composition may be deformed or the quality thereof may be adversely affected.

Also, with these photopolymerization initiators, the photopolymerizing faculty thereof by a light source having a visible light region of longer than 400 nm. is remarkably lower than the photopolymerizing faculty thereof by a light source having an ultraviolet region of shorter than 400 nm. Accordingly, with a photopolymerizable composition containing conventional-type photopolymerization initiators, the application range has been greatly limited.

With regard to photopolymerization systems responsive to visible light, various attempts have been proposed. For example, U.S. Pat. No. 2,850,445 indicates that a certain types of photoreducible dyes such as rose bengal, eosin, and erythrosene, have effective visible light respondence. Furthermore, there has been proposed, as improved techniques, a composite initiation system composed of a dye and an amine (See Japanese Patent Publication No. 20189/69); a system composed of hexaarylbi-imidazole, a radical generating agent, and a dye (See Japanese Patent Publication No. 37377/70); a system composed of hexaarylbi-imidazole and p-dialkylaminobenzylidene ketone (See Japanese Patent Application (OPI) Nos. 2528/72 and 155292/79); a system composed of a 3-keto-substituted coumarin compound and an active halogen compound (See Japanese Patent Application (OPI) No. 15503/83); and a system composed of a substituted triazine and a merocyanine dye (See Japanese Patent Application (OPI) No. 151024/79). The term "OPI" as used herein indicates an "unexamined published application".

These techniques are certainly effective with visible light. However, the photosensitive speed thereof is still unsatisfactory and further improvements are desired.

Recently, a method of increasing the sensitivity to ultraviolet rays and a method of forming images using a laser have been investigated. Also, a UV projection exposure method for use in making printing plates, making a direct printing plate by laser, laser facsimile, and pholography, have already been practically employed. High-sensitive photosensitive materials for these methods have been developed. However, the sensitivity of these photosensitive materials is still unsatisfactory.

SUMMARY OF THE INVENTION

The primary object of the present invention, therefore, is to provide a high-sensitive photopolymerizable composition. That is, to provide a photopolymerizable composition containing photoplymerization initiator capable of increasing the photopolymerization speed of a general photopolymerizable composition containing a polymerizable compound having an ethylenically unsaturated bond.

Another object of the present is to provide a photopolymerizable composition containing a photopolymerization initiator having high sensitivity to visible light of longer than 400 nm. in wavelength, and in particular, light having a wavelength of about 488 nm. corresponding to the output of an Ar+ laser.

As the result of various investigations directed to obtaining the above objects, the inventors have unexpectedly discovered that a particular photpolymerization initiator system greatly increases the photopolymerization speed of a polymerizable compound having an ethylenically unsaturated bond and gives a high sensitivity to visible light having wavelengths of longer than 400 nm.

According to the present invention, there is provided a photopolymerizable composition containing (i) an addition polymerizable compound having at least one ethylenically unsaturated double bond, (ii) a photopolymerization initiator, and, optionally, (iii) a linear organic high molecular weight polymer, wherein the photopolymerization initiator comprises a combination of (a) at least one organic boron anion salt of an organic cationic dye compound, and (b) a trihalomethyl-s-triazine compound represented by formula (I):

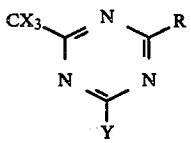

(I)

wherein X represents a halogen atom; Y represents —CX$_3$, —NH$_2$, —NHR', —N(R')$_2$ or —OR' wherein R' represents an alkyl group, a substituted alkyl group, an aryl group, or a substituted aryl group or a substitued alkenyl group; and R represents —CX$_3$, an alkyl group, a substituted alkyl group, an aryl group, a substituted aryl group, or a substituted alkenyl group.

DETAILED DESCRIPTION OF THE INVENTION

Polymerizable compounds having an ethylenically unsaturated bond which are useful in the present invention are compounds having at least one ethylenically unsaturated bond in the chemical structure thereof, and which have a chemical mode such as a monomer a prepolymer i.e., thereof, and a dimer, a trimer, or an oligomer, or a mixture thereof and copolymers thereof.

Examples of suitable monomers and copolymers thereof include esters of unsaturated carboxylic acids and aliphatic polyhydric alcohol compounds, and amides of unsaturated carboxylic acids and aliphatic polyhydric amine compounds.

Specific examples of monomers of the esters of aliphatic polyhydric alcohol compounds and unsaturated carboxylic acids include an acrylic acid ester, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipehtaerythritol hexaacrylate, sorbitol triaacrylate, sorbitol tetracrylate, sorbitol pentaacrylate, sorbitol hexaacrylate, tri(acryloyloxyethyl)isocyanurate, and a polyester acrylate oligomer.

Examples also include monomers of methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol, hexamethacrylate, sorbitol trimethacrylate, sorbitol tetramethacrylate, bis-[p-(3-methacryloxy-2-hydroxypropoxy)phenyl]dimethylmethane, bis[p-(meth-acryloxyethoxy)phenyl]dimethylmethane, etc.

Examples further include itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

Crotonic acid esters such as ethylene glycol dicrotonate, tetramethylene glycol dicrotonate, pentaerythritol dicrotonate, and sorbitol tetradicrotonate may also be used.

Furthermore, isocrotonic acid esters such as ethylene glycol diisocrotonate, pentaerythritol diisocrotonate, and sorbitol tetraisocrotonate are useful, as well as maleic acid esters such as ethylene glycol dimaleate, triethylene glycol dimaleate, pentaerythritol dimaleate, and sorbitol tetramaleate, etc.

Mixtures of the above-described ester monomers can be also used.

Specific monomers of amides of an aliphatic polyhydric amine compounds and an unsaturated carboxyolic acids include methylenebis-acrylamide, methylenebis-methacrylamide, 1,6-hexamethylenebis-acrylamide, 1,6-hexamethylenebis-methacrylamide, diethylenetriamine-trisacrylamide, xylylenebis-acrylamide, and xyxlylenebismethacrylamide.

Other examples of the above-described monomers include vinylurethane compounds having two or more polymerizable vinyl groups in one molecule obtained by adding a vinyl monomer having a hydroxy group shown by following formula (A) to a polyisocyanate compound having two or more isocyanate groups in one molecule such as those described in Japanese Patent Publication No. 41708/73;

(A)

wherein R and R' each represent a hydrogen atom or a methyl group.

Also, examples of monomers for use in the present invention include polyfunctional acrylates and methacrylates such as urethane acrylates such as those described in Japanese Patent Application (OPI) No. 37193/76, polyester acrylates such as those described in Japanese Patent Application (OPI) No. 64183/73 and Japanese Patent Publication No. 49191/74 and 30490/77, and epoxy acrylates obtained by reacting epoxy resins and (meth)acrylic acid. Furthermore, light-hardening monomers and oligomers described in *Nippon Setchaku Kyokai Shi (Journal of Adhesive Society of Japan)*, Vol. 20, No. 7 pp.300–308, can be also used.

The amount of the monomer is from 5 to 50% by weight, and is preferably from 10 to 40% by weight based on the total components.

The photopolymerization composition of the present invention contains a photopolymerization initiator. The photopolymerization initiator includes a compound represented by formula (I):

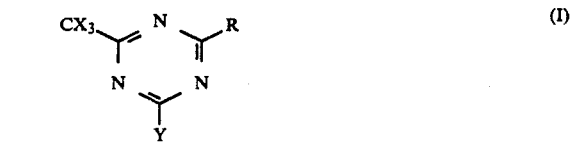

(I)

wherein X represents a halogen atom; Y represents —CX$_3$, —NH$_2$, —NHR', —N(R')$_2$ or —OR' wherein R' represents an alkyl group, a substituted alkyl group, an aryl group, or a substituted aryl group; and R represents —CX$_3$, an alkyl group, a substituted alkyl group, an aryl group, a substituted aryl group, or a substituted alkenyl group. Such a compound is described in Wakabayashi et al, *Bull. Chem. Soc. Japan*, 42, 2924 (1969). Specific examples of the compound include 2-phenyl-4,6-bis(tichloromethyl)-s-traizine, 2-(p-chlorophenyl)-4,6-bis(trichloromethyl)-s-triazine, 2-(p-tolyl)-

4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-5-triazine, and 2-(α.α.β-trichloroethyl)-4,6-bis(trichloromethyl)-s-triazine.

Other examples of the compound represented by formula (I) include the compounds described in British Pat. No. 1,388,492, such as 2-styryl-4,6-bis(trichloromethyl)-s-traizine, 2-(p-methylstyryl)-4,6-bis(trichloromethyl)-s-traizine, 2-(p-methoxystyryl)-4,6-bis(trichloromethyl)-s-traizine, and 2-(p-methoxystyryl)-4-amino-6-trichloromethyl-s-traizine; and the compound described in Japanese Patent Application (OPI) No. 133428/78 corresponding to British Pat. No. 1,602,903, such as 2-(4-methoxy-naphtho-1-yl)-4,6-bis-trichloromethyl-s-triazine, 2-(4-ethoxy-naphtho-1-yl)-4,6-bistrichloromethyl-s-triazine, 2-[4-(2-ethoxyethyl)-naphtho-1-yl]-4,6-bis-trichloromethyl-s-triazine, 2-(4,7-dimethoxy-naphtho-1-yl)-4,6-bis-trichloromethyl-s-triazine, and 2-(acenaphtho-5-yl)-4,6-bis-trichloromethyl-s-triazine.

Even further examples thereof include the compounds described in U.S. Pat. No. 4,619,998 such as:

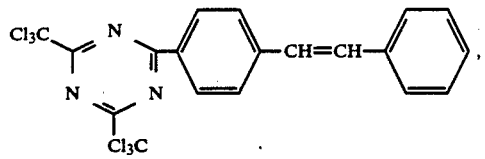

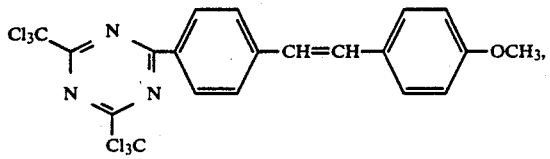

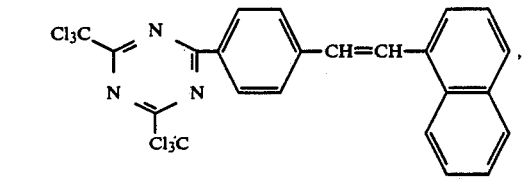

-continued

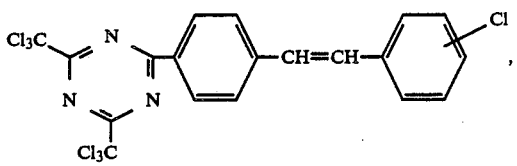

Still other examples of the compound represented formula (I) are as follows:

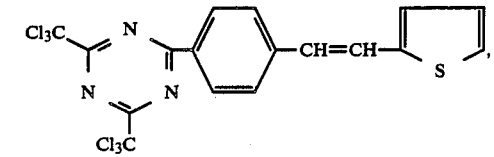

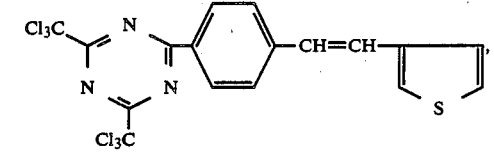

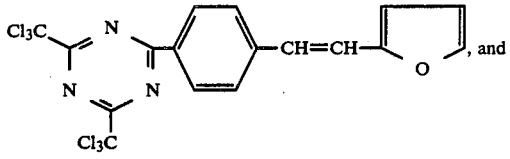, and

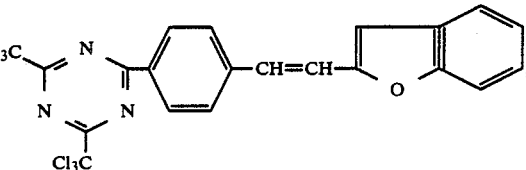

Also example of the aforesaid compound are those described in F. C. Schaefer et al, *Journal of Organic Chemistry*, 29, 1527 (1964), such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine.

Further examples of the aforesaid compound are those compounds described in Japanese Patent Application (OPI) No. 58241/87 corresponding to U.S. application Ser. No. 903,711 filed Sept. 5, 1986, such as:

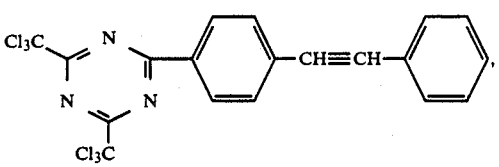

-continued
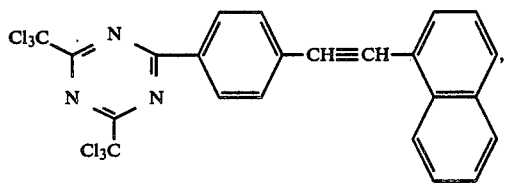
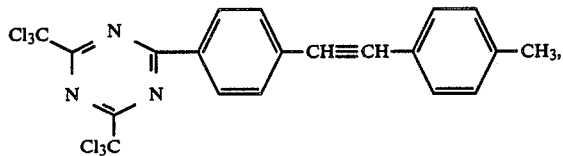
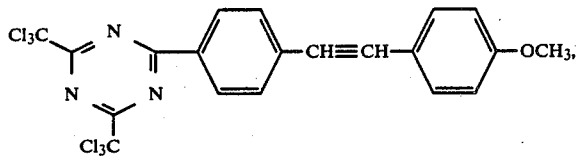
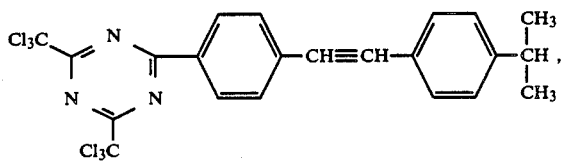
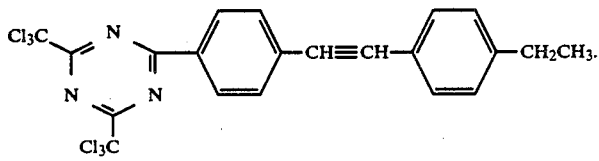
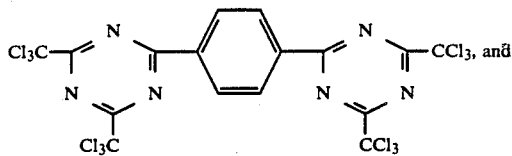
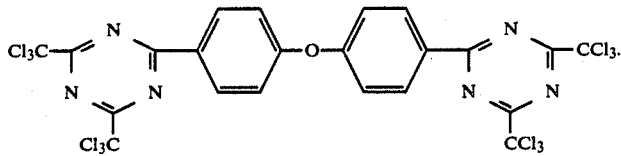
Further examples are those described in British Pat. No. 2,195,121, such as:
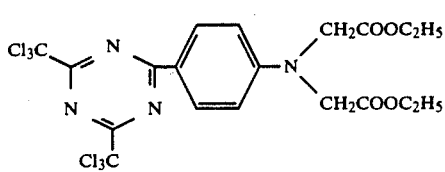
and
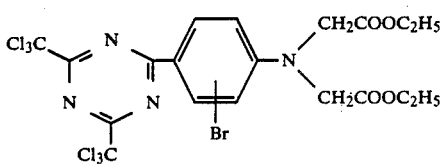
Of the compounds shown by formula (I) described above, those wherein Y is $-CX_3$, are particularly preferred.
The photopolymerization initiator also includes an organic boron compound anion salt of an organic cationic dye. Those which can be effectively used in the present invention are preferably those represented by formula (II):

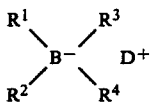 (II)

wherein D+ represents a cationic dye; wherein $R^1$, $R^2$, $R^3$, and $R^4$, which may be the same or different, each represent a substituted or unsubstituted alkyl group, a substituted or unsubstitued aryl group, a substituted or unsubstituted alkenyl group, a substituted or unsubstituted alkynyl group, or a substituted or unsubstituted heterocyclic group, and two or more of said $R^1$, $R^2$, $R^3$ and $R^4$ may combine with each other to form a cyclic structure.

An alkyl group represented by $R^1$ to $R^4$ includes a straight, branched or cyclic alkyl group and preferably has 1 to 18 carbon atoms, such as a methyl group, an ethyl group, a propyl group, an isopropyl group, a butyl group, a pentyl group, a hexyl group, an octyl group, a stearyl group, a cyclobutyl group, a cyclopentyl group, a cyclohexyl group, etc.

A substituted alkyl group represented by $R^1$ to $R^4$ includes an alkyl group described above having a substituent, such as a halogen atom, e.g., a chlorine atom, a bromine atom, etc.; a cyano group; a nitro group; an aryl group, preferably, a phenyl group; a hydroxyl group; a $-N=R^5R^6$ group, wherein $R^5$ and $R^6$ each represents a hydrogen atom, an alkyl group having 1 to 14 carbon atoms or an aryl group; a $-COOR^7$ group, wherein $R^7$ represents a hydrogen atom, an alkyl group having 1 to 14 carbon atoms or aryl group; a $-OCOR^8$ group or a $-OR^8$ group, wherein $R^8$ represents an alkyl group having 1 to 14 carbon atoms or an aryl group.

An aryl group represented by $R^1$ to $R^4$ includes an aryl group having 1 to 3 rings, such as a phenyl group, a naphthyl group, etc., and a substituted aryl group represented by $R^1$ to $R^4$ includes an aryl group described above having the same substituent as that for the alkyl group or an alkyl group having 1 to 14 carbon atoms.

An alkenyl group represented by $R^1$ to $R^4$ includes a straight, branched or cyclic alkenyl group having 2 to 18 carbon atoms and a substituent for the alkenyl group includes the same substituent as that for the alkyl group.

An alkynyl group represented by $R^1$ to $R^4$ includes a straight or branched alkynyl group having 2 to 18 carbon atoms, and a substituent for the alkynyl group includes the same substituent as that for the alkyl group.

A heterocyclic group represented by $R^1$ to $R^4$ includes a 5 or more-membered ring, preferably 5 to 7-membered ring containing at least one atom selected from the group consisting of N, S and O, and the heterocyclic ring may contain a condensed ring. The substituent for the heterocyclic group includes the same substituent as that for the aryl group. The amount of the compound represented by formula (I) is 0.001 to 10 parts by weight, more preferably 0.005 to 5 parts by weight and most preferably 0.01 to 3 parts by weight, based on 1 part by weight of the organic boron anion salt of the organic cationic dye compound.

The organic cation dye for use in the present invention includes, for example, cationic methine dyes such as, preferably, polymethine dyes, cyanine dyes, and azomethine dyes, and more preferably cyanine, carbocyanine, and hemicyanine; carbonium dyes such as, preferably triarylmethane dyes, xanthene dyes, and acrydine dyes, and more preferably rhodamine; quinoneimine dyes such as, preferably, azine dyes, oxazine dyes, and thiazine dyes; and quinoline dyes.

These dyes may be used singly or as a combination thereof.

In the present invention, commercially available dyes or known dyes can be used as the aforesaid organic cation dyes. Specific examples of these dyes are described, for examples, in "Enki Sei Senryo (Basic Dyes)" of *Senryo Binran* (*Dye Handbook*), edited by the Society of Organic Chemistry, T. H. James, *The Theory of the Photographic Process,* pp. 194–290, published by Macmillan Publishing Co., Ltd., 1977, *Kinosei Shikiso no Kagaku* (*Chemistry of Functional Coloring Matters*), pages 1-32, 189-206, and 401-413, published by CMC Shuppan Sha, and Japanese patent Application (OPI) No. 189340/84.

Of the aforesaid dyes, cyanine dyes, azine dyes and xanthene dyes are particularly useful in this invention.

Practical examples of cyanine dyes which are useful in the present invention are the dyes represented by formula (III):

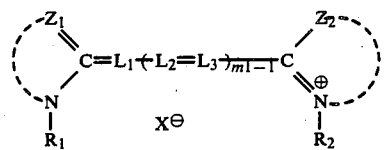

wherein $Z_1$ and $Z_2$ each represents an atomic group necessary for completing a heterocyclic nucleus, which is usually used for a cyanine dye, such as, in particular, a thiazole nucleus, a thiazoline nucleus, a benzothiazole nucleus, a naphthothiazole nucleus, an oxazole nucleus, an oxazoline nucleus, a benzoxazole nucleus, a naphthoxazole nucleus, a tetrazole nucleus, a pyridine nucleus, a quinoline nucleus, an imidazoline nucleus, an imidazole nucleus, a benzimidazole nucleus, a naphthoimidazole nucleus, a selenazoline nucleus, a selenazole nucleus, a benzoselenazole nucleus, a naphthoselenazole nucleus, and an indolenine nucleus. These nuclei may be substituted by a lower alkyl group (e.g., a methyl group), a halogen atom, a phenyl group, a hydroxy group, an alkoxy group having from 1 to 4 carbon atoms, a carboxy group, an alkoxycarbonyl group, an alkylsulfamoyl group, an alkylcarbonyl group, an acetyl group, an acetoxy group, a cyano group, a trichloromethyl group, a trifuloromethyl group, and a nitro group.

In formula (III) set forth above, $L_1$, $L_2$, and $L_3$ each represents a methine group or a substituted methine group. Example of the substituent for the substituted methine group are a lower alkyl group (such as a methyl group, an ethyl group, etc.), a phenyl group, a substituted phenyl group, a methoxy group, an ethoxy group, and an aralkyl group (e.g., a phenethyl group).

$L_1$ and $R_1$, $L_3$ and $R_2$, or $L_2$ and $L_2$ in the case of m is 3 may be alkylene-crosslinked to form a 5- to 6-membered ring.

In formula (III), $R_1$ and $R_2$ each represents a lower alkyl group (e.g., preferably, an alkyl group having 1 to 8 carbon atoms), or an alkyl group substituted by a carboxy group, a sulfo group, a hydroxy group, a halogen atom, an alkoxy group having from 1 to 4 carbon atoms, a phenyl group, a substituted phenyl group (preferably, the alkylene moiety having from 1 to 5 carbon atoms), such as β-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl, and 3,3,3-trifluoroethyl, an allyl group, or other substituted alkyl group usually used for the N-substituent of cyanine dyes.

In formula (III), $m_1$ represents 1, 2, or 3, and $X_1^\ominus$ represents the same boron compound anion as in formula (II).

Specific examples of the xanthene dyes useful in the present invention are those dyes represented by formula (IV):

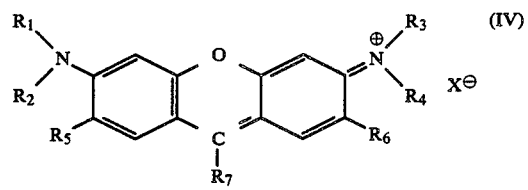

wherein $R_1$, $R_2$, $R_3$, $R_4$, $R_5$, $R_6$ and $R_7$ each represents a hydrogen atom, an alkyl group having from 1 to 6 carbon atoms or an aryl group; X represents a boron compound anion as described in formula (II); and Y represents an alkyl group, an aryl group, a hydrogen atom, or an alkali metal.

Examples of the organic boron compound anion salt of the preferred organic cationic dye compound for use in the present invention are illustrated below, but the invention is not limited to these compounds.

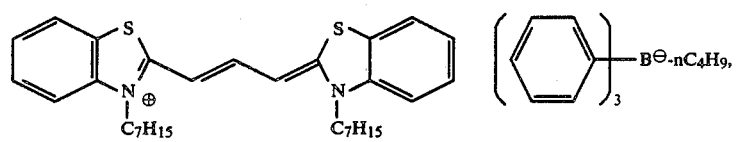

1

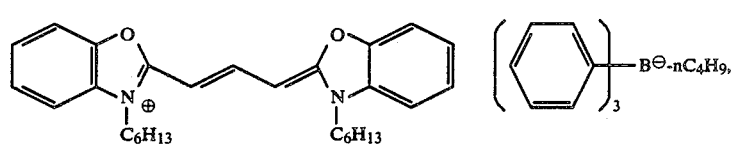

2

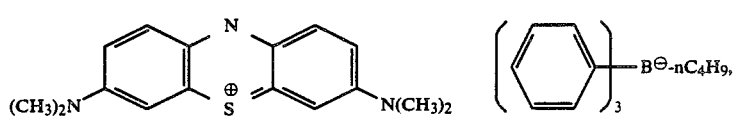

3

4

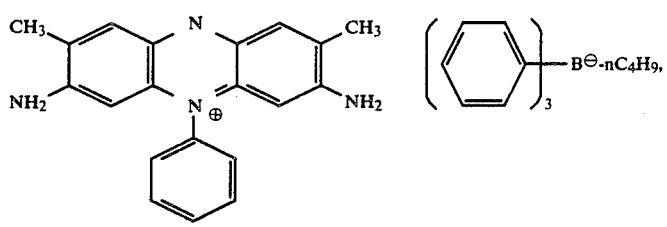

5

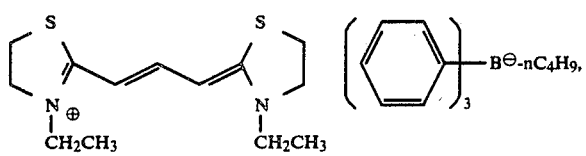

6

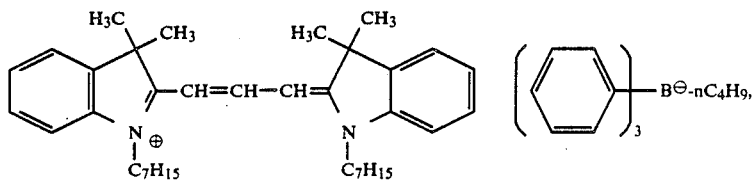

7

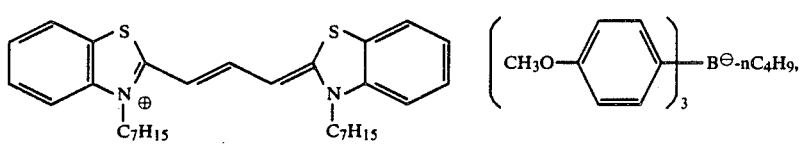

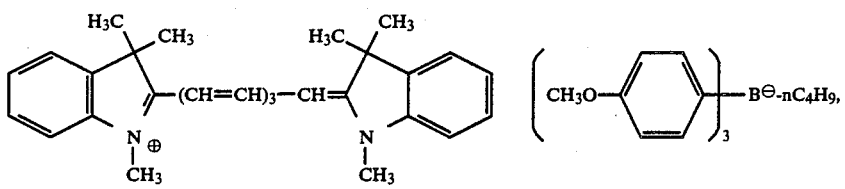

8

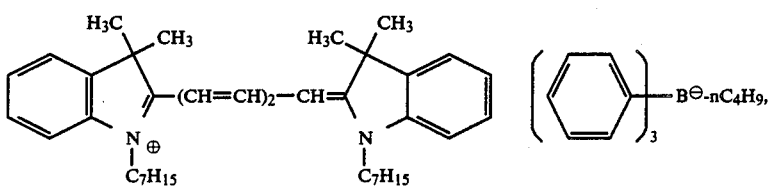

9

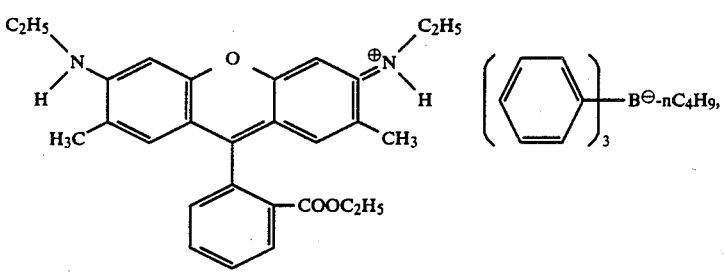

10

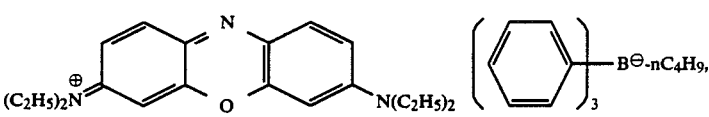

11

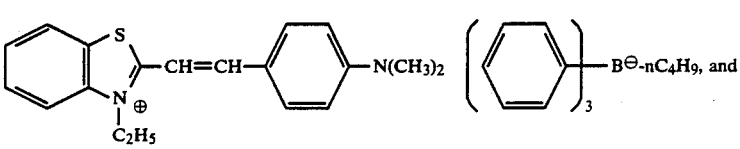

12

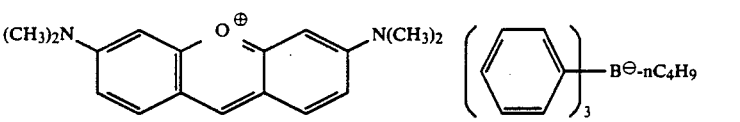

13

The content of the photopolymerization initiator used in the photopolymerizable composition of the present invention is usually small. When the content is too large, undesirable results such as the interception of the effective light occur. Thus, the amount of photopolymerization initiator used in the present invention should range from about 0.01 to about 60% by weight, and more preferably from 1 to 30% by weight based on the total weight of the photopolymerizable ethylenically unsaturated compound and linear organic high molecular weight polymer if used.

Also, the photopolymerizable composition of the present invention can further contain, if necessary, an organic amine compounds to further increase the photopolymerization initiating faculty thereof. Examples of such organic amine compounds are triethanolamine, dimethylamine, diethanolaniline, p-dimethylaminobenzoic acid ethyl ester, and Michler's ketone.

If used, the amount of the organic amine compound is preferably from about 50% to about 200% by weight based on the amount of photopolymerization initiator.

Furthermore, if necessary, the photopolymerizable composition of the present invention may contain a hydrogen donative compound such as N-phenylglycine, 2-mercaptobenzothiazole, and N,N-dialkylbenzoic acid alkyl ester, thereof, to further increasing the photopolymerization initiating faculty.

As "linear organic high molecular weight polymer" which may be used in the present invention, any linear organic high molecular weight polymers having compatibility with the above-described polymerizable ethylenically unsaturated compounds can be, as a matter of course, used. However, a linear organic high molecular weight polymer soluble in, or swellable with, water or weak alkaline water for enabling the development with water or weak alkaline water is preferably used. The linear organic high molecular weight polymer is used not only as a film-forming agent of the photopolymerizable composition, but also for rendering the composition developable with water, weak alkaline water or an organic solvent. For example, when a water-soluble organic high molecular weight polymer is used, the photopolymerizable composition can be developed with water.

Preferable linear organic high molecular weight polymer has $1\times10^3$ to $1\times10^6$, and more preferably $5\times10^3$ to $5\times10^5$ of weight average molecular weight.

Examples of such a linear organic molecular weight polymers include addition polymers having a carboxylic acid group at the side chain such as those described in Japanese Patent Publication Nos. 34327/79 and 12577/83, and 25957/79, and Japanese Patent Application (OPI) Nos. 44615/84, 92723/79, 53836/84, and 71048/84. Specific examples include methacrylic acid copolymers, acrylic acid copolymers, itaconic acid copolymes, crotonic acid copolymes, maleic acid copolymers, and partially esterified maleic acid copolymers.

Also, acid cellulose derivatives having carboxylic acid groups at the side chain can be similarly used as the linear organic high molecular weight polymer.

Furthermore, a polymer obtained by adding a cyclic acid anhydride to an addition polymer having a hydroxy group is also useful.

In the above polymers copolymer of benzyl(meth)acrylate, (meth)acrylic acid, and, if necessary, addition polymerizable vinyl monomers and copolymers of allyl (meth)crylate, (meth)acrylic acid, and, if necessary, other addition polymerizable vinyl monomers are particularly suitable for the present invention.

Still other water-soluble linear organic high molecular weight polymers, include polyvinylpyrrolidone and polyethylene oxide. Furthermore, for increasing the strength of the hardened film or layer of the composition of the present invention, alcohol-soluble nylon and polyethers of 2,2-bis(4-hydroxyphenyl)-propane and epichlorohydrin, are useful.

The linear organic high molecular weight polymer may be incorporated on the photopolymerizable composition in an any desired proportion. However, proportion thereof is over 90% by weight, is undesirable effects in terms of strength of images formed may result. Thus, the proportion thereof is preferably from 30 to 85% by weight based on the weight of the photopolymerizable composition. Also, the mixing ratio of the photopolymerizable ethylenically unsaturated compound to the linear organic high molecular weight polymer is preferably in the range of from about 1/9 to about 7/3, and more preferably from about 3/7 to about 5/5.

The photopolymerizable composition of the present invention preferably contains a small amount of the heat polymerization inhibitor for inhibiting the occurrence of unnecessary heat polymerization of the polymerizable ethylenically unsaturated compound during the production or storage of the photopolymerizable composition. Examples of suitable proper heat polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzoimidazole, and N-nitrosophenylhydroxyamine cerous salt.

If added, the amount of the heat polymerization inhibitor preferably ranges from about 0.01% to about 5% by weight based on the total amount of the composition.

Also, if necessary, the photopolymerizable composition may contain e.g., a higher fatty acid derivative, to prevent polymerization hindrance by oxygen. The amount of high fatty acid derivatives preferably ranges from about 0.5 to about 10% by weight based on the total amount of the composition.

Still further, the photopolymerizable composition of the present invention may contain a dye or a pigment for coloring the photosensitive layer. The amount of the dye or pigment preferably ranges from about 0.5% to about 5% by weight based on the total amount of the composition.

In addition to these additives, an inorganic filler or other known additives may be added to the photopolymerizable composition of the present invention for improving the properties of the hardened film or layer.

The photopolymerizable composition of the present invention may be coated as a solution in an organic solvent. Examples of suitable organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monoethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, and γ-butyrolacetone, methyl lactate, and ethyl lactate.

These solvents may be used singly or as a mixture thereof. Also, the concentration of solid components in the coating composition may range from about 2 to about 50% by weight.

The coating amount of the composition is suitably from about 0.1 g/m² to about 10 g/m², and more preferably from about 0.5 g/m² to about 5 g/m² as dry coverage.

As the support for the composition of the present invention, a dimensionally stable plate-form material may be used. Examples of dimensionally stable plate-form materials include papers, papers laminated with a plastic e.g., polyethylene, polypropylene, and polystyrene), plates of a metals such as aluminum (including aluminum alloys), zinc, and copper, films of plastics such as diacetyl cellulose, triacetyl cellulose, cellulose propionate, cellulose butyrate, cellulose acetate butyrate, cellulose nitrate, polyethylene terephthalate, polyethylene, polystyrene, polypropylene, polycarbonate and polyvinyl acetal, and papers or plastic films laminated or vapor-deposited with the above-described metals. Of these materials, an aluminum plate is particularly preferred since this plate is very dimensionally stable and inexpensive. Furthermore, a composite sheet composed of a polyethylene terephthalate film having formed thereon an aluminum sheet or foils such as that described in Japanese Patent Publication No. 18327/73, is also preferably used as the support.

In the case of a support having the surface of metal, and in particular, aluminum, it is preferred that the surface is subjected to a surface treatment such as graining treatment, dipping treatment in an aqueous solution of, for example, sodium silicate, potassium fluorozirconate, and a phosphate, or anodic oxidation treatment.

Furthermore, an aluminum plate which is grained and then subjected to a dipping treatment in an aqueous solution of sodium silicate is preferably used. Also, a method such as that described in Japanese Patent Publication No. 5125/72, wherein an aluminum plate is subjected to an anodic oxidation treatment and then to a dipping treatment in an aqueous solution of an alkali metal silicate, is preferably used.

The aforesaid anodic oxidation treatment is practiced by passing electric current through an electrolyte composed an aqueous solution or non-aqueous solution of an inorganic acid such as phosphoric acid, chromic acid, sulfuric acid, or boric acid, an organic acid such as oxalic acid, or sulfamic acid, singly or as a combination thereof, using the aluminum plate as the anode.

Also, as described in U.S. Pat. No. 3,658,662, silicate electrode position can be effectively used as the surface treatment of an aluminum plate.

Furthermore, an aluminum support subjected to electrolytically graining and then to a surface treatment of a combination of anodic oxidation treatment and sodium silicate treatment such as that disclosed in Japanese Patent Publication No. 27481/71 and Japanese Patent Application (OPI) No. 58602/77 and 30503/77, is also useful with the present invention.

Also, an aluminum support subjected, in succession, to mechanical graining, chemical etching, electrolytic graining, anodic oxidation treatment, and further sodium silicate treatment such as that disclosed in Japanese Patent Application (OPI) No. 28893/81 may be suitably used with the present invention.

Furthermore, an aluminum support which is subjected to the aforesaid surface treatment(s) and then sub-coated with a water-soluble resin such as a polymer or a copolymer having a sulfonic acid group at the side chain, polyvinylphosphonic acid, polyacrylic acid, a water-soluble metal salt (e.g., zinc borate), a yellow dye, and an amine salt, etc., may be used.

The above hydrophilic treatment is applied for imparting a hydrophilic property to the surface of the support as well as for preventing the occurrence of the harmful reaction of the photopolymerizable composition formed on the support and improving the adhesion of the photosensitive layer.

On the layer of the photopolymerizable composition formed on the support, a protective layer composed of a polymer having an excellent oxygen intercepting properties, such as polyvinyl alcohol or acid celluloses, may be used to prevent polymerization inhibiting action by oxygen in air. A coating method for forming such a protective layer is described in e.g., U.S. Pat. No. 3,458,311 and Japanese Patent Publication No. 49729/80.

On the layer of the photopolymerizable composition formed on the support, a protective layer composed of a polymer excellent in oxygen intercepting properties, such as polyvinyl alcohol or acid celluloses, may be formed for preventing the occurrence of the polymerization inhibiting action by oxygen in air. A coating method for forming such a protective layer is described in e.g., U.S. Pat. No. 3,458,311 and Japanese Patent Publication No. 49729/80.

The photopolymerizable composition of the present invention can be used for an ordinary photopolymerization reaction. Furthermore, the composition of the present invention can be used in various fields such as printing plates, photoresists, and for making printing base plates. In particular, the photopolymerizable composition of this invention gives good results when applied to photosensitive materials for visible light lasers such as Ar+ lasers due to the high sensitivity and the wide spectral sensitivity characteristics thereof.

A printing plate using the photopolymerizable composition as the present invention is imagewise exposed and the unexposed portions of the photosensitive layer are removed by a developer to provide images.

As preferred examples of suitable developers for the photopolymerizable composition of the present invention when used for lithographic printing plates, the developers described in Japanese Patent Publication No. 7427/82 may be used. Specific examples thereof include an aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, and an aqueous ammonia or organic alkali agents such as monoethanolamine and diethanolamine. The concentration of the aqueous alkali solution may range from about 0.1 to about 10% by weight, and preferably from 0.5 to 5% by weight.

Also, the alkaline aqueous solution may, if necessary, contain a surface active agent and an organic solvent such as benzyl alcohol, 2-phenoxy ethanol and 2-butoxy ethanol. For example, the additives described in U.S. Pat. Nos. 3,375,171 and 3,615,480 can be used.

Furthermore, the developers such as those described in Japanese Patent Application (OPI) Nos. 26601/75 and 54341/83, and Japanese Patent Publication Nos. 39464/81 and 42860/81, are preferably used with the present invention.

The photopolymerizable composition of the present invention has high sensitivity for active light from ultraviolet light to visible light. Accordingly, as the light source for the composition of the present invention, a very high pressure, high pressure, intermediate pressure or low pressure mercury lamp, a chemical lamp, a carbon arc lamp, a xenon lamp, a metal halide lamp, various lasers from visible light to ultraviolet light, a fluorescent lamp, a tungsten lamp or sun light can be used. In the interest of brevity and conciseness, the contents of the aforementioned numerous patents and articles are hereby incorporated by reference.

The present invention is further illustrated by the following Examples. However, the present invention is not intended to be in any way limited thereby

EXAMPLES 1 TO 2

After graining the surface of an aluminum plate of 0.30 mm in thickness using a nylon brush treated and treatment with an aqueous suspension of pumice stone of 400 mesh, the plate was washed well with water. Then, after etching the surface thereof by dipping the plate in an aqueous 10% sodium hydroxide solution for 60 seconds at 70° C., the plate was washed with running water, neutralized with an aqueous 20% sulfuric acid solution, and washed again with water. The aluminum plate was subjected electrolytic graining treatment in an aqueous 1% nitric acid solution at an anodic electric amount of 160 coulombs using a sine wave a laminating electric current under the condition of 12.7 volts ($V_A$). The measured surface roughness was 0.6 $\mu$m (shown by Ra). Thereafter, the plate was dipped in an aqueous solution of 30% sulfuric acid for performing desmatting for 2 minutes at 55° C. and then subjected to an anodic oxidation treatment in an aqueous 20% sulfuric acid solution at an electric current density of 2 A/$dm^2$ so that the coverage of the anodic oxidation layer became 2.7 g/$m^2$.

On the thus treated aluminum plate was coated a photosensitive composition liquid having the following composition at a dry coating amount of 1.5 g/m², and the layer was dried at 80° C. for 2 minutes to form a photosensitive layer.

| | |
|---|---|
| Trimethylolpropane Tri(acryloyl-oxypropyl) Ether | 2.0 g |
| Acryl methacrylate/methacrylic acid Copolymer (80/20 by mole ratio) | 2.0 g |
| Polymerization Initiator (shown in Table 1) | |
| Copper Phthalocyanine Pigment | 0.2 g |
| Fluorine Series Nonionic Surface Active Agent (Fluorad FC-430, trade name, made by 3M Co.) | 0.03 g |
| Methyl Ethyl Ketone | 20 g |
| Propylene Glycol Monomethyl Ether Acetate | 20 g |

On the photosensitive layer thus formed was coated an aqueous solution of 3% by weight polyvinyl alcohol (saponification degree of 86.5 to 89 mole %, polymerization degree 1,000) at a dry coating amount of 2 g/m² and dried for 2 minutes at 100° C.

The sensitivity test by visible light was performed using a monochromatic visible light and Ar+ laser light (wavelength of 488 nm). The visible light was obtained using a tungsten through Kenko Optical Filter SC 40. The measurement of sensitivity was performed using Fuji PS Step Guide (made by Fuji Photo Film Co., a step tablet having the transparent optical density at the initial state of 0.05 while increasing, in succession, by 0.15 for step up to 15 stages).

The sensitivity was shown by the clear step number of the PS step guide in the case of exposing for 120 seconds at an illuminance at the surface portion of the photosensitive layer of 200 Lux to evaluate sensitivity.

As laser light, a single line of 488 nm, in wavelength of Ar+ laser (Model 95-3, mady by Lexel Co.) was used at a beam diameter of 100 μm and laser was scanned while changing the intensity of the Ar+ laser. The line width obtained after development was measured and the intensity of the Ar+ laser in the case or reproducing the line width of 100 μm was employed as the sensitivity.

The development was performed by immersing the photosensitive element in a developer having the following composition at 25° C. for one minute.

| | |
|---|---|
| Potassium Silicate (having about 2.1 of a molar ratio of $SiO_2/K_2O$) | 30 g |
| Potassium Hydroxide | 15 g |
| $C_{12}H_{25}$-C$_6$H$_4$-O-C$_6$H$_4$-SO$_3$Na | 3 g |
| Water | 1000 g |

The measured sensitivities obtained which reflect the effects resulting from changing the photopolymerization initiator are shown in Table 1 below.

TABLE 1

| | Photopolymerization Initiator | | Clear Step No (Step) by SC40 Filter Light | Sensitivity (mJ/cm²) by Ar+ lazer light |
|---|---|---|---|---|
| Example 1 | Compound No. 6 | 0.1 g | 9.2 | 2.0 |
| | 2-(p-methoxyphenyl)-4,6-bis(trichloromethyl)-s-triazine | 0.1 g | | |
| Example 2 | Compound No. 6 | 0.1 g | 9.0 | 2.1 |
| | 2-(p-Acetylphenyl 4,6-bis(trichloromethyl)-s-triazine | 0.1 g | | |
| Comparative Example 1 | Compound No. 6 | 0.1 g | 7.0 | 4.2 |
| Comparative Example 2 | 2-(p-methoxyphenyl)-4,6-bis(trichloromethyl)-s-triazine | 0.1 g | no image formed | ≧48 |
| Comparative Example 3 | 2-(p-Acetylphenyl)-4,6-bis(trichloromethyl)-s-triazine | 0.1 g | no image formed | ≧48 |
| Example 3 | Compound No. 10 | 0.1 g | | |
| | 2-(p-Acetylphenyl)-4,6-bis(trichloromethyl)-s-triazine | 0.1 g | 11.2 | 1.0 |
| Example 4 | Compound No. 13 | 0.1 g | | |
| | 2-(p-Acetylphenyl)-4,6-bis(trichloromethyl)-s-triazine | 0.1 g | 11.1 | 1.1 |

From the results set forth above, it can be seen that when the salt of an organic cationic dye and an organic boron compound anion are used together with the trihalomethyl-s-traizine compound, the sensitivity of the photopolymerizable composition is high. However, when the salt only is used or the trihalomethyl-s-traizine compound is not used, the sensitivity of the composition is low.

EXAMPLE 5

The same procedure as Example 1 was followed while the polymerization initiators were changed shown in Table 2 below, and the test with visible light as in Example 1 was performed. The results obtained are shown in Table 2.

TABLE 2

| | Photopolymerizable Initiator | | Clear Step No (Step) by SC40 filter light |
|---|---|---|---|
| Example 5 | Compound 9 | 0.1 | 4.3 |
| | 2-(p-methoxyphenyl)-4,6-bis-(trichlormethyl)-s-triazine | 0.1 | |

TABLE 2-continued

| | Photopolymerizable Initiator | | Clear Step No (Step) by SC40 filter light |
|---|---|---|---|
| Comparative Example 4 | 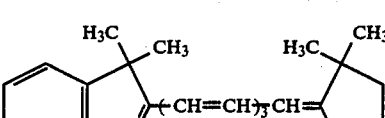 | 0.1 | no image formed |
| | 2-(p-methoxyphenyl)-4,6-bis-(trichlormethyl)-s-triazine | 0.1 | |
| Comparative Example 5 | Compound 9 | 0.1 | 2.0 |

As shown in the above Table, it can be seen that when the salt of an organic cationic dye and an organic boron compound anion are used together with the trihalomethyl-2-triazine compound, the sensitivity of the photopolymerizable composition is high. However, when the salt of an organic cationic dye and a material other than an organic boron compound anion is used, together with the trihalomethyl-s-triazine compound, the sensitivity of the composition is low.

While the invention has been described in detail and with reference to specific embodiments thereof, it will be apparent to one skilled in the art that various changes and modifications can be made thereto without departing from the spirit and scope thereof.

What is claimed is:

1. A photopolymerizable composition comprising (i) a polymerizable compound having at least one ethylenically unsaturated bond and capable of being photopolymerized by active light in an amount such that a light-exposed portion thereof will separate from a light-unexposed portion thereof when treated with a developer, and (ii) a photopolymerization of said polymerizable compound, wherein said photopolymerization initiator contains (a) at least one organic boron compound anion salt of the organic cationic dye is a salt represented by formula (II):

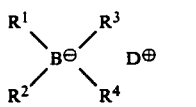 (II)

wherein $D^{\oplus}$ represents a cationic dye; $R^1$, $R^2$, $R^3$, and $R_4$, which may be the same or different, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more of said $R^1$, $R^2$, $R^3$ and $R^4$ may combine with each other to form a cyclic structure; and (b) a compound represented by formula (I):

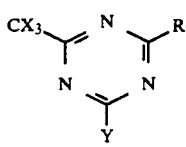 (I)

wherein X represents a halogen atom; Y represents $-CX_3$, $-NH_2$, $-NHR'$, $-N(R')_2$, or $-OR'$ wherein R' represents an alkyl group, a substituted alkyl group, an aryl group, or a substituted aryl group; and wherein R represents $-CX_3$, an alkyl group, a substituted alkyl group, an aryl group, a substituted aryl group, or a substituted alkenyl group.

2. A photopolymerizable composition according to claim 1, wherein said cationic dye is one of a methane dye, a carbonium dye, a quinoneimine dye or a quinoline dye.

3. A photopolymerizable composition according to claim 1, wherein said cationic dye is one of a cyanine dye, an azine dye or a xanthene dye.

4. A photopolymerizable composition according to claim 1, wherein Y is $-CX_3$.

5. A photopolymerizable composition according to claim 1, wherein said polymerizable compound (i) is selected from the group of esters of unsaturated carboxylic acids and liphatic polyhydric alcohol compounds, and amides of unsaturated carboxylic acids and aliphatic polyhydric amine compounds, and mixtures thereof.

6. A photopolymerizable composition according to claim 1, containing from about 5 to about 50% by weight of said polymerizable compound (i).

7. A photopolymerizable composition according to claim 6, containing from about 10 to about 40% by weight of said polymerizable compound (i).

8. A photopolymerizable composition according to claim 1, containing from about 0.01 to about 60% by weight of photopolymerization initiator (ii), based on the total amount of polymerizable compound (i).

9. A photopolymerizable composition according to claim 1, containing from about 1 to about 30% by weight of photopolymerization initiator (ii), based on the total amount of polymerizable compound (i).

10. A photopolymerizable composition according to claim 1, further comprising (iii) a linear organic high molecular weight polymer.

11. A photopolymerizable composition according to claim 10, comprising from about 30 to about 85% by weight based on the total weight of polymerizable composition, of said linear high molecular weight polymer (iii).

12. A photopolymerizable composition according to claim 11, wherein the mixing ratio of component (i) to the linear high molecular weight polymer (iii) ranges from about 1/9 to about 7/3 by weight ratio.

13. A photopolymerizable composition according to claim 12, wherein the mixing ratio ranges from about 3/7 to about 5/5 by weight ratio.

14. A photopolymerizable composition according to claim 1, further comprising at least one of an organic amine compound, a hydrogen donative compound and a radical generating agent.

15. A coated support comprising a support having coated therein a layer of the composition of claim 1.

16. A coated support according to claim 15 further comprising a protective layer.

17. A coated support comprising a support having coated thereon a layer of the composition of claim 10.

18. A photopolymerizable composition according to claim 8, wherein the amount of the compound represented by formula (I) ranges from about 0.001 to about 10 parts by weight based on 1 part by weight of the organic boron anion salt of the cationic dye compound.

19. A photopolymerizable composition according to claim 18, wherein the amount of the compound represented by formula (I) ranges from about 0.01 to 3 parts by weight based on 1 part by weight of the organic boron anion salt of the organic cationic dye compound.

20. A photopolymerizable composition comprising (i) from about 5 to 50% by weight of the composition of a polymerizable compound having at least one ethylenically unsaturated bond and capable of being photopolymerized by active light and (ii) from about 0.01 to about 60% by weight based on the total amount of compound (i) of a photopolymerization initiator, wherein said photopolymerization initiator (ii) contains (a) at least one organic boron compound anion salt of an organic cationic dye, wherein the organic boron compound anion salt of the organic cationic dye is a salt represented by formula (II):

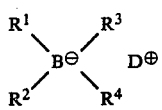 (II)

wherein $D^{\oplus}$ represents a cationic dye, $R^1$, $R^2$, $R^3$, and $R^4$, which may be the same or different, each represent a substituted or unsubstituted alkyl group, a substituted or unsubstituted aryl group, a substituted or unsubstituted alkenyl group, a substituted or unsubstituted alkenyl group, or a substituted or unsubstituted heterocyclic group, and two or more of said $R^1$, $R^2$, $R^3$ and $R^4$ may combine with each other to form a cyclic structure; and (b) from about 0.001 to about 10 parts by weight based on 1 part by weight of the organic boron anionic salt of the cationic dye compound of a compound represented by formula (I):

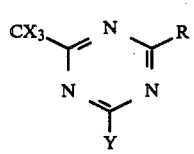 (I)

wherein X represents a halogen atom; Y represents $-CX_3$, $-NH_2$, $-NHR'$, $-N(R')_2$, or $-OR'$ wherein R' represents an alkyl group, a substituted alkyl group, an aryl group, of a substituted aryl group; and wherein R represents $-CX_3$, an alkyl group, a substituted alkyl group, an aryl group, a substituted aryl group, or a substituted alkenyl group.

21. A photopolymerizable composition according to claim 20 further comprising (iii) from about 30 to about 85% by weight based on the total weight of the composition of a linear high molecular weight polymer.

22. A coated support comprising a support having coated thereon a layer of the composition of claim 20.

23. A coated support comprising a support having coated thereon a layer of the composition of claim 21.

* * * * *